United States Patent

Wenzig

[15] 3,694,705

[45] Sept. 26, 1972

[54] SEMICONDUCTOR DIODE WITH PROTECTIVE RING

[72] Inventor: Wolfgang Wenzig, Munich, Germany

[73] Assignee: Siemens Aktiengesellschaft, Berlin, Germany

[22] Filed: Feb. 8, 1971

[21] Appl. No.: 113,382

[30] Foreign Application Priority Data

Feb. 13, 1970 Germany..........P 20 06 729.2

[52] U.S. Cl. ....317/235 R, 317/235 AH, 317/234 N, 317/235 AM, 29/584

[51] Int. Cl...........................H01l 11/00, H01l 15/00

[58] Field of Search........317/234, 235, 46, 46.1, 5.4; 29/584, 585, 586, 587, 588, 589

[56] References Cited

UNITED STATES PATENTS

| | | | |
|---|---|---|---|
| 3,154,692 | 10/1964 | Shockley | 317/235 AG |
| 3,309,241 | 3/1967 | Dickson | 317/235 AG |
| 3,341,380 | 9/1967 | Mets et al. | 317/235 AG |
| 3,341,378 | 9/1967 | Gerlach et al | 317/235 AG |
| 3,463,977 | 8/1969 | Grove et al. | 317/235 AG |
| 3,519,897 | 7/1970 | Ferrell | 317/235 AG |
| 3,534,231 | 10/1970 | Biard | 317/235 AG |
| 3,551,760 | 12/1970 | Tokuyama | 317/235 AG |

*Primary Examiner*—James D. Kallam
*Assistant Examiner*—Andrew J. James
*Attorney*—Curt M. Avery, Arthur E. Wilfond, Herbert L. Lerner and Daniel J. Tick

[57] ABSTRACT

In a semiconductor diode in which a zone of another conductance type is inserted into the surface of a zone of one conductance type, the zone of the other conductance type is enclosed by a ring-shaped region of the other conductance type, the depth of penetration of the ring-shaped region being less than the depth of penetration of the zone of the other conductance type. Due to appropriate doping of the ring-shaped region only the middle portion of the PN junction which possesses a curvature, participates in the electrical breakdown. The semiconductor diode according to the present invention has improved characteristic data.

3 Claims, 4 Drawing Figures

SEMICONDUCTOR DIODE WITH PROTECTIVE RING

My invention relates to a semiconductor diode having a zone of another conductance type inserted into the surface of a zone of one conductance type and a PN junction formed between the zone of the one conductance type and the zone of another conductance type. The invention also relates to a method for producing such a semiconductor diode.

It is known to provide semiconductor diodes with a protective ring when the region of the blocking voltage breakdown is to be shifted from the surface of the semiconductor body into the interior of the latter. If the semiconductor body is N-conducting for instance, a ring-shaped P-conducting zone is produced by diffusion for the aforementioned purpose, through a ring-shaped diffusion window, whereby the ring-shaped P-conducting zone surrounds a P-conducting zone installed into the surface of the N-conducting semiconductor body. The depth of penetration of the P-conducting zone is much smaller than the depth of penetration of the ring-shaped zone. Altogether, this produces a P-conductive region in the N-conducting semiconductor body in whose middle portion, the PN-junction extends parallel to the surface of the semiconductor body. The middle portion is enclosed by a P-conducting region of a greater depth of penetration than that of the middle portion. The depth of penetration of the middle portion and of the ring-shaped zone is such that an electric breakdown takes place only in the planar middle portion, that is in the interior of the semiconductor body and not at the surface of the semiconductor body. By contrast to a semiconductor diode, or a planar diode without a protective ring where the convexly curved edge part of the PN-junction as well as the planar middle part contribute to the electrical breakdown, the aforedescribed known semiconductor diode provided with a protective ring, completely lacks the effect of a convexly curved PN-junction which participates in the breakdown. It was found that this has an adverse effect upon various characteristic data of a semiconductor diode. Examples of this adverse effect which may be mentioned are the higher dynamic resistance of the breakdown characteristic and the magnitude of the noise voltage.

It is an object of the invention to provide a semiconductor diode with protective ring which is not afflicted with the afore indicated, detrimental characteristic data.

To this end and in accordance with the invention, the area formed by the PN-junction, consists of a middle portion extending parallel or almost parallel to the surface and of a part which encloses the middle portion and is curved toward the surface, as well as of an edge part which surrounds the curved part and emerges to the surface. The regions of the zone of one conductance type, which border the edge portion and/or of the zone of the other conductance type, are so constructed that an electric breakdown occurs only in the middle portion and/or in the curved portion of the PN-junction.

The semiconductor diodes of my invention possess the best qualities of the known semiconductor diodes with protective ring, as well as characteristic data which are improved with respect to the known diodes.

A further feature of my invention is that the region of the zone of the other conductance type that is adjacent to the edge portion consists of a protective ring which surrounds the middle portion as well as the curved part. The protective ring has a smaller depth of penetration of the zone of the other conductance type into the zone of the one conductance type, than the middle portion. The doping gradient of the protective ring is small relative to the doping gradient of the remaining region of the zone of the other conductance type. An electric breakdown occurs only in the middle portion and/or in the curved part of the PN-junction.

Another preferred embodiment of the invention is that the ring-shaped region of the zone of the other conductance type adjacent to the edge part, is doped stronger than the remaining part of the zone of the other conductance type and that the region of the zone of the one conductance type adjacent to the edge portion is doped weaker than the remaining part of the zone of the one conductance type.

Other features and details of the invention are derived from the following description of an embodiment example, with reference to the FIGS. wherein.

Figure 1:
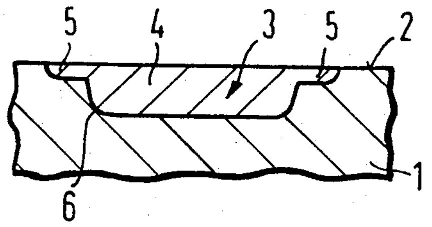
FIG. 1 is a section through a diode of a first embodiment of the invention.

In FIG. 1, an N-conducting zone 1 of a semiconductor body is illustrated into whose surface 2 is produced a strongly P-doped region 3. The P-doped region 3 comprises a circular middle portion 4 and a circular ring-shaped region 5, surrounding the middle portion 4. The circular ring-shaped region 5 acts as a protective ring for the circular middle portion 4. The doping gradient of the circular ring-shaped region 5 is so small that an electrical breakdown occurs only in the circular middle portion 4. The latter, however, has a convexly curved PN-junction 6. The semiconductor diode illustrated in FIG. 1 has, therefore, also the effect of a convexly curved PN-junction that participates in the electrical breakdown. This has a beneficial effect upon the indicated characteristic data.

The doping gradient desired for the circular ring-shaped region 5 may be attained through diffusion with slight surface concentration or through diffusion with a doping source which is effective only at the onset of the diffusion process.

The semiconductor body 1 may also be P-conducting and region 3 is N-conducting. The semiconductor diode resulting therefrom has the same beneficial characteristics as the semiconductor diode disclosed above with reference to FIG. 1.

Figure 2:
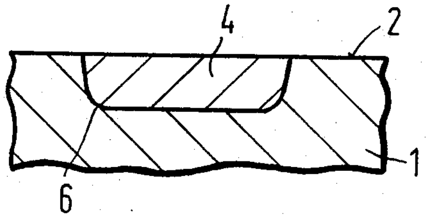
FIGS. 2 and 3 illustrate, in section, a method for producing the diode of FIG. 1.
Figure 3:
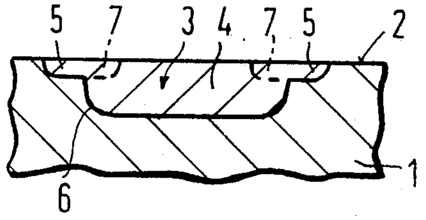

FIGS. 2 and 3 disclose another method for producing the object of FIG. 1. The components appearing in FIGS. 2 to 4 are indicated with the same reference numerals as in FIG. 1.

The surface 2 of the N-conducting semiconductor body is first provided with a circular P-doped region 4 by conventional masking technique. The surface 2 is then coated with another masking layer which is not illustrated in FIGS. 2 and 3, for the sake of clarity. A circular ring-shaped window is installed into this other masking layer, through which the circular ring-shaped region 5 is produced by diffusion, as shown in FIG. 3. At the same time, region 4 and the circular ring-shaped region 5 overlap. Region 5 is also P-doped in the characteristic portion of region 5 which is indicated as 7 in FIG. 3.

Figure 4:
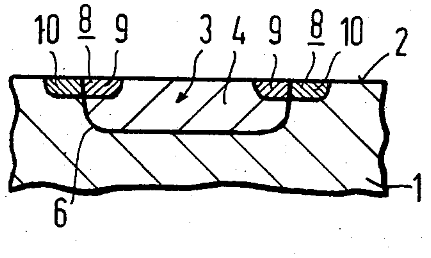
FIG. 4 is a section through a diode of a second embodiment of the invention.

FIG. 4 shows another preferred embodiment of the invention which is disclosed in greater details, as follows.

The surface 2 of an N-doped semiconductor body 1 is provided with a strongly P-doped region 3 which comprises the middle portion 4 and a part which has a curved PN-junction 6. The curved PN-junction 6 thus surrounds the middle portion 4 in the form of a ring, as in the first embodiment. A region 9 is P-doped somewhat stronger than the middle portion 4. The region 10 is N-doped somewhat weaker than the semiconductor body 1. The regions 9 and 10 surround the surface 2 of the middle portion 4, in the form of circular rings. The somewhat weaker N-doping of the region 10 prevents an electric breakdown in the vicinity of the surface 2, i.e., in the edge portion of the PN-junction.

A method of producing the diode of FIG. 4 will be briefly disclosed as follows:

The surface 2 of the semiconductor body 1 is first provided with a ring-shaped zone 8, the latter being inserted into the body 1. The zone 8 has the same shape and configuration as the circular ring-shaped region 5 of FIG. 3 or the regions 9 and 10 of FIG. 4. Unlike region 5, zone 8 is provided only slightly with P-type dopants. As a result, the doping degree of zone 8 is less than that of the semiconductor body 1 so that the net doping of the zone 8 remains as a whole, still N-conducting. In another method step, the interior of the ring, formed through zone 8, is provided by diffusion with the strongly P-doped middle portion, which middle portion 4 overlaps said ring in region 9. As a result, region 9 is somewhat more P-doped than the middle portion 4, while the region 10 of zone 8 is somewhat less N-doped than the remaining semiconductor body 1.

In the claims, the limitation parallel also includes almost parallel.

I claim:

1. A semiconductor diode having a zone of another conductance type inserted into the surface of a zone of the one conductance type and a PN junction formed between the zone of one conductance type and the zone of the other conductance type, wherein the area formed through the PN junction consists of a middle portion running parallel to the surface, a part which is curved toward the surface and which encloses said middle portion, and of an edge portion surrounding said curved part and emerging to the surface, an annular part of the zone of the other conductance type which is adjacent to the edge portion is doped stronger than the remaining parts of the zone of the other conductance type, while an annular part of the zone of the other conductance type adjacent to the edge portion, is doped weaker than the remaining part of the zone of the one conductance type, whereby an electric breakdown occurs only in the middle part and in the curved part of the PN junction.

2. The device of claim 1 wherein the middle portion is circularly shaped and the curved portion and the edge portion are shaped as a circular ring.

3. The method of producing a semiconductor diode having a zone of another conductance type inserted into the surface of a zone of the one conductance type and a PN junction formed between the zone of one conductance type and the zone of the other conductance type, wherein the area formed through the PN junction consists of a middle portion running parallel to the surface, a part which is curved toward the surface and which encloses said middle portion, and of an edge portion surrounding said curved part and emerging to the surface, the regions of the zone of one conductance type adjacent to said edge portion and of the zone of the other conductance type are designed so that an electric breakdown occurs only in the middle part and in the curved part of the PN-junction, the annular part of the zone of the other conductance type which is adjacent to the edge portion is doped stronger than the remaining parts of the zone of the other conductance type while the annular part of the zone of the other conductance type adjacent to the edge portion, is doped weaker than the remaining part of the zone of the one conductance type, which comprises providing a semiconductor body of the one conductance type through insertion, with a zone of the other conductance type so that the area of the resulting PN-junction has a middle portion running parallel to the surface of the semiconductor body and a portion which is curved toward the surface and emerges to said surface, surrounding said middle portion, inserting an annular zone of the other conductance type into the regions of the semiconductor body and into the zone of the other conductance type, both adjacent to the PN-junction which emerges to the surface, the doping gradient of the annular zone of the other conductance type is so slight that the regions of the semiconductor body which are adjacent to the PN-junction that emerges to the surface, have a lower net doping of the one conductance type compared to the remaining regions of the semiconductor body.

* * * * *